(12) United States Patent
Chen et al.

(10) Patent No.: US 11,750,005 B2
(45) Date of Patent: Sep. 5, 2023

(54) BATTERY CONTROLLER AND BATTERY LEVEL MEASUREMENT METHOD THEREOF

(71) Applicant: DELTA ELECTRONICS, INC., Taoyuan (TW)

(72) Inventors: Chin-Ming Chen, Taoyuan (TW); Cheng-Chien Huang, Taoyuan (TW); Mu-Min Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 149 days.

(21) Appl. No.: 17/110,261

(22) Filed: Dec. 2, 2020

(65) Prior Publication Data

US 2021/0194261 A1   Jun. 24, 2021

(30) Foreign Application Priority Data

Dec. 23, 2019   (TW) .................................. 108147173

(51) Int. Cl.
*H02J 7/00*      (2006.01)
*G01R 31/3842*   (2019.01)

(52) U.S. Cl.
CPC ........ *H02J 7/0048* (2020.01); *G01R 31/3842* (2019.01); *H02J 7/00304* (2020.01)

(58) Field of Classification Search
CPC ................ H02J 7/0048; H02J 7/00304; G01R 31/3842; G01R 31/3828
(Continued)

(56) References Cited

U.S. PATENT DOCUMENTS

| 9,537,325 B2 * | 1/2017 | Igarashi ............. G01R 31/3842 |
| 2004/0135544 A1 * | 7/2004 | King ....................... B60L 58/18 |
| | | 320/116 |

(Continued)

FOREIGN PATENT DOCUMENTS

| CN | 103529393 A | 1/2014 |
| CN | 103797375 B | 5/2016 |

(Continued)

OTHER PUBLICATIONS

C. Duan et al., "A Solar Power-Assisted Battery Balancing System for Electric Vehicles," in IEEE Transactions on Transportation Electrification, vol. 4, No. 2, pp. 432-443, Jun. 2018, doi: 10.1109/TTE.2018.2817123 (Year: 2018).*

*Primary Examiner* — Thienvu V Tran
*Assistant Examiner* — Sreeya Sreevatsa
(74) *Attorney, Agent, or Firm* — CKC & Partners Co., LLC (57) ABSTRACT

A battery controller includes an auxiliary measurement energy-storing component, a control unit, a measuring unit and a protection unit. The auxiliary measurement energy-storing component is coupled in series to a battery module outside the controller, and configured to provide an open-circuited voltage. The control unit is configured to output a power value of the battery module according to the open-circuited voltage or a value of current flowing through the battery module. The measuring unit is configured to measure the current flowing through the battery module and transmit the measuring result to the control unit. The protection unit is configured to limit the value of current measured by the measuring unit to a predetermined value. A battery level measurement method of the battery controller is also disclosed.

13 Claims, 4 Drawing Sheets

(58) Field of Classification Search
USPC .......................................................... 361/93.9
See application file for complete search history.

(56) References Cited

U.S. PATENT DOCUMENTS

| | | |
|---|---|---|
| 2010/0138178 A1 | 6/2010 | Paryani et al. |
| 2010/0244847 A1* | 9/2010 | Kudo ..................... B60L 58/10 |
| | | 324/433 |
| 2016/0043578 A1* | 2/2016 | Miyamoto ............ H02J 7/0014 |
| | | 320/118 |
| 2020/0021099 A1* | 1/2020 | Borgwardt ........... H02H 1/0007 |
| 2022/0155380 A1* | 5/2022 | Sung .................... G01R 31/396 |

FOREIGN PATENT DOCUMENTS

| | | | |
|---|---|---|---|
| JP | 2009-259607 A | | 11/2009 |
| JP | 2013-211157 A | | 10/2013 |
| JP | 2014220236 A | * | 11/2014 |
| JP | 2015-038437 A | | 2/2015 |
| JP | 2017060316 A | * | 3/2017 |
| KR | 1463394 B1 | * | 11/2014 |
| TW | 297170 B | | 2/1997 |
| TW | I507705 B | | 11/2015 |
| TW | 201901179 A | | 1/2019 |

* cited by examiner

BATTERY CONTROLLER AND BATTERY LEVEL MEASUREMENT METHOD THEREOF

CROSS-REFERENCE TO RELATED APPLICATION

This application claims priority to Taiwan Application Serial Number 108147173, filed Dec. 23, 2019, which is herein incorporated by reference in its entirety.

BACKGROUND

Field of Invention

The present invention relates to a battery controller. More particularly, the present invention relates to a battery controller and a battery level measurement method thereof.

Description of Related Art

Nowadays, calculation of battery level is the important function for electronic products. The traditional unitary estimation method will cause accumulated errors and gradually decrease the accuracy under the long term measurement, and the traditional unitary estimation method makes the prediction of the state of charge (SOC) misaligned and indirectly affects the related functions of the battery protection. For example, in order to calculate the SOC, the Coulomb counting method is generally used, that is, the charge and discharge current is integrated with time and then the dynamic SOC of the battery could be estimated. However, this method requires high accuracy of the current measurement, and accumulated errors are easily caused by inaccurate calculations of the residual SOC under the long term calculation.

SUMMARY

To solve the aforesaid questions, one aspect of the present disclosure is to provide a type of the battery controller, coupled between a battery module and a charge and discharge circuit. The battery controller includes an auxiliary measurement energy-storing component, a control unit, a measuring unit and a protection unit.

The battery controller of the present disclosure includes an auxiliary measurement energy-storing component, a control unit, a measuring unit and a protection unit. The control unit is coupled to the auxiliary measurement energy-storing component and the measuring unit respectively. The auxiliary measurement energy-storing component is coupled to the battery module, the measuring unit and the control unit. The auxiliary measurement energy-storing component is coupled in series to the battery module relatively to the charge and discharge circuit. The measuring unit is coupled in series to the battery module relatively to the charge and discharge circuit, and the measuring unit is coupled to the control unit. The protection circuit is coupled to the battery module and the charge and discharge circuit, to limit the current value to be not greater than a predetermined value.

In the present disclosure, the battery module includes at least two lithium batteries and has a first discharge curve.

In the present disclosure, the auxiliary measurement energy-storing component is a lithium battery having a second discharge curve different from the first discharge curve of the battery module.

In the present disclosure, the battery module is charged and discharged through the charge and discharge circuit, the measuring unit measures a current value of current flowing through the battery module and provides the current value to the control unit. The control unit calculates a first SOC value according to the current value.

In the present disclosure, when the battery module is in a static condition, the auxiliary measurement energy-storing component provides an open-circuited voltage to the control unit. The control unit generates a second SOC value according to the open-circuited voltage. The second SOC value is configured to modify or replace the first SOC value.

In this disclosure, the protection circuit is a relay or fuse.

The other aspect of the present disclosure provides a type of battery level measurement method, including the following operations:

1. Determines whether the battery module is in the static condition.

2a. In response to that the battery module not be in a static condition and then performs the following operations: the measuring unit measures the current value of the current through the battery module, the control unit utilizes the Coulomb counting method to calculate and output the first SOC value according to the current value.

2b. In response to that the battery module be in a static condition and then performs the following operations: the auxiliary measurement energy-storing component provides the open-circuited voltage to the control unit. The control unit generates the second SOC value according to the open-circuited voltage and SOC data. The second SOC value is configured to modify or replace the first SOC value.

In summary, the embodiment of the present disclosure utilizes the auxiliary measurement energy-storing component connected in series to the battery module to be measured, and the residual SOC of the battery to be measured can be modified according to the open-circuited voltage of the auxiliary measurement energy-storing component in response to the battery as in a static condition, which can avoids the inaccuracy caused by accumulated errors of the traditional method and estimates the residual SOC accurately.

It is to be understood that both the foregoing general description and the following detailed description are by examples and are intended to provide further explanation of the invention as claimed.

BRIEF DESCRIPTION OF THE DRAWINGS

The invention can be more fully understood by reading the following detailed description of the embodiment with reference to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure, and descriptions of structure operation do not intend to limit the order of execution, any structure that reassembles the components to produce a device with equal efficacy is within the scope of the present invention. In addition, the illustrations are for illustration purposes only and are not drawn to full size. In order to facilitate understanding, the same elements in the following description will be described with the same symbols.

The terms used throughout the specification and the scope of patent applications, unless otherwise specified, they usually have the ordinary meaning of each term used in this field, in the content disclosed here and in special content. Certain terms used to describe this disclosure are discussed below or elsewhere in this specification to provide an additional guidance to those skilled in the art on the description of this disclosure.

It will be understood that, although the terms of first, second, third etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In the description herein and throughout the claims that follow, the terms "comprise" or "comprising," "include" or "including," "have" or "having," "contain" or "containing" and the like used herein are to be understood to be open-ended, i.e., to mean including but not limited to.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

Several embodiments of this disclosure will be disclosed graphically below. For clarity, many practical details will be explained in the following description. However, it should be understood that these practical details should not be applied to limit the disclosure. That is, in some embodiments of this disclosure, these practical details are unnecessary. In addition, in order to simplify the drawings, some conventional structures and elements will be shown in the drawings in a simple and schematic manner.

Figure 1A:
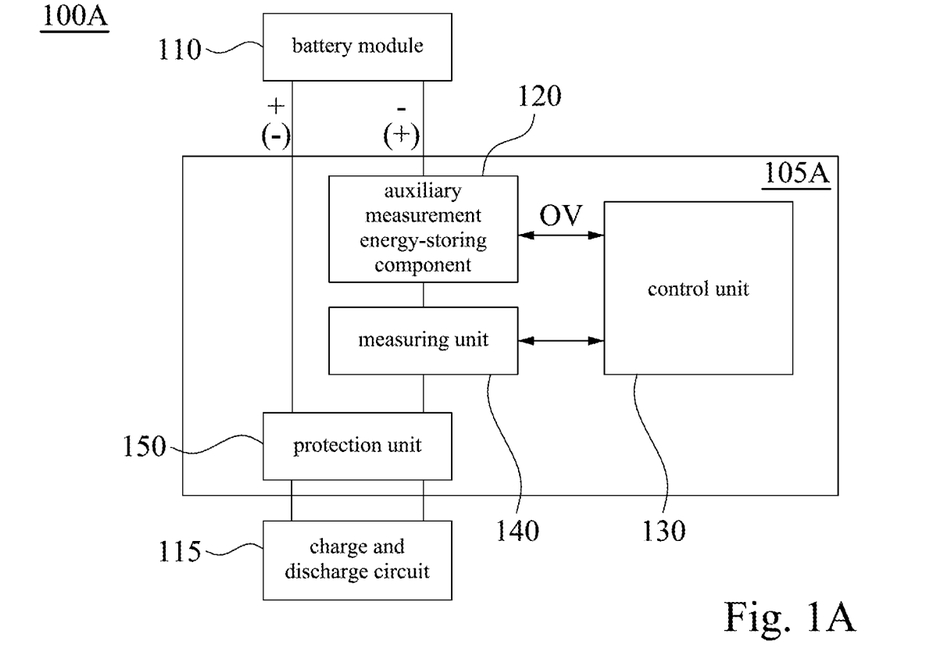
FIG. 1A is a schematic diagram of a battery control system in accordance with one embodiment of the present disclosure.

FIG. 1A is a schematic diagram illustrating a type of a battery control system 100A in accordance with one of the embodiment of the present disclosure. Referring to FIG. 1A, the battery control system 100A includes a battery controller 105A, wherein the battery controller is configured to be coupled between a battery module 110 and a charge and discharge circuit 115. In the embodiment of the present disclosure, the battery controller 105A includes an auxiliary measurement energy-storing component 120, a control unit 130, a measuring unit 140 and a protection unit 150. The auxiliary measurement energy-storing component 120 is coupled to the battery module 110 and the measuring unit 140. The auxiliary measurement energy-storing component 120 is also coupled to the control unit 130. The auxiliary measurement energy-storing component 120 is coupled in series to the battery module 110 relatively to the charge and discharge circuit 115. The measuring unit 140 is coupled in series to the battery module 110 relatively to the charge and discharge circuit 115. The measuring unit 140 is coupled to the control unit 130, and the measuring unit 140 is configured to measure a current value of current flowing through the battery module 110 and transmit a measured result to the control unit 130. The protection unit 150 is coupled between the battery module 110 and the charge and discharge circuit 115, and further coupled to the measuring unit 140 and the auxiliary measurement energy-storing component 120.

As the embodiment shown in FIG. 1A, the battery module 110 is coupled in series to the auxiliary measurement energy-storing component 120 and the measuring unit 140 relatively to the charge and discharge circuit 115, and the auxiliary measurement energy-storing component 120 is located between the battery module 110 and the measuring unit 140.

Referring to FIG. 1A, the battery module 110 includes at least one battery (not shown), and a state of charge (SOC) of battery module 110 has the corresponding changes in response to that the battery module 110 is charged or discharged.

In the present disclosure, the battery module 110 includes at least one lithium battery. The at least one lithium battery of the battery module 110 is connected in serial or parallel to each other according to the consideration of outputting the voltage or the current.

Figure 2A:
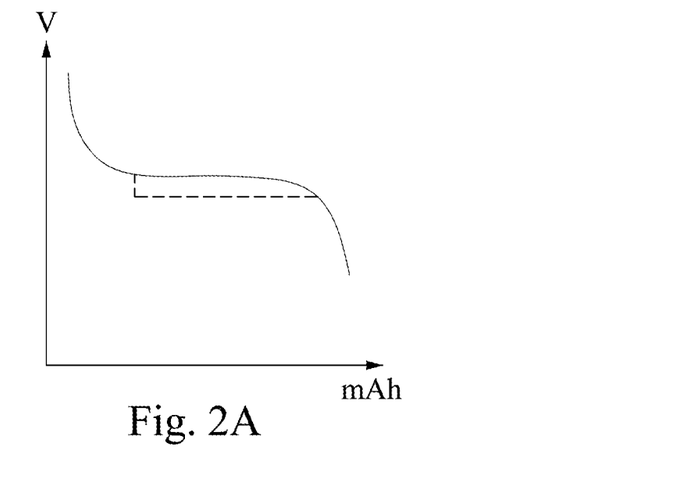
FIG. 2A is a schematic diagram of a first discharge curve of the battery module in accordance with one embodiment of the present disclosure.

Reference is made to FIG. 2A, FIG. 2A is a first discharge curve of the battery module 110 of the present embodiment. That is, the two-dimensional schematic diagram is the open-circuited voltage OV of the battery module 110 relatively to the SOC. Referring to FIG. 2A, vertical axis unit is voltage (V), horizontal axis unit is milliamp hours (mAh). In some embodiments, the curve of FIG. 2A illustrates the change between the aforesaid open-circuited voltage OV and the SOC of the battery module 110. Wherein the aforesaid voltage of the battery module may be expressed as the first SOC value SOC1. Furthermore, the change of voltage relatively to the change of battery capacity (mAh) of the battery module 110 is not obviously in response to that the battery module 110 is discharged for a long term. That is, the slope of the first discharge curve is small, thus the errors are easily caused while estimating the SOC.

Figure 2B:
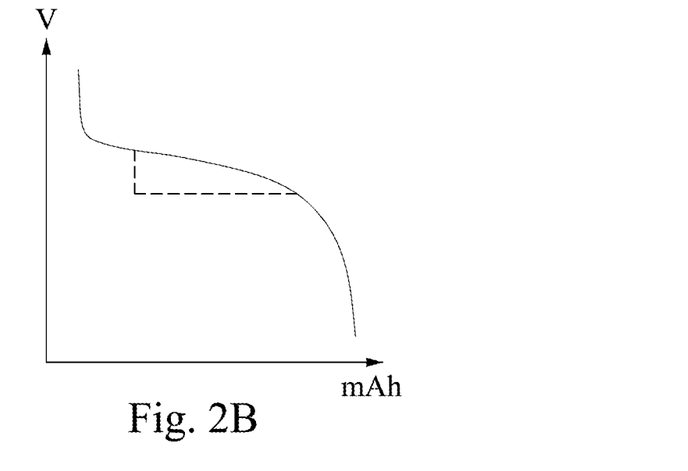
FIG. 2B is a schematic diagram of a second discharge curve of the auxiliary measurement energy-storing component in accordance with one embodiment of the present disclosure.

Reference is also made to FIG. 2B, FIG. 2B is a second discharge curve of the auxiliary measurement energy-storing component 120 in accordance with the present embodiment. Different from FIG. 2A, in response to that the auxiliary measurement energy-storing component 120 is discharged for the long term, the change of the voltage relatively to the change of the battery capacity (mAh) in the second discharge curve is obviously. That is, the slope of the second discharge curve is large, thus the errors are not easily caused while estimating the SOC.

In response to that the battery module 110 is coupled in series to the auxiliary measurement energy-storing component 120, while the battery module 110 and the auxiliary measurement energy-storing component 120 are discharging, both of them have the same decreasing ratio of the SOC. In the case of the battery module 110 coupled in series to the auxiliary measurement energy-storing component 120, the auxiliary measurement energy-storing component 120 is also configured to provide the corresponding open-circuited voltage OV.

In the present embodiment, the composition of the lithium battery of the auxiliary measurement energy-storing component 120 is different from that of the at least one of the lithium batteries of the battery module 110, and both of they have the different discharge curves.

In the present embodiment, the auxiliary measurement energy-storing component 120 may be following constituent components, but not in the limit: a lithium cobalt oxide battery ($LiCoO_2$), lithium manganese oxide battery ($LiMn_2O_4$), lithium nickel oxide battery ($LiNiO_2$), lithium nickel manganese oxide battery ($Li(Ni_xCo_yMn_z)O_2$), electric double-layer capacitor (electric double layer capacitor) or combinations thereof.

In some embodiments, a maximum value of the capacity of the battery module 110 is equal to or less than a maximum value of the capacity of the auxiliary measurement energy-storing component 120. In other words, the maximum first SOC value SOC1 of the battery module 110 is not greater than the maximum second SOC value SOC2 of the auxiliary measurement energy-storing component 120.

As the embodiment shown in FIG. 1A, the control unit 130 is coupled to the auxiliary measurement energy-storing component 120, configured to measure the open-circuited voltage OV of the auxiliary measurement energy-storing component 120, and the open-circuited voltage OV is utilized to estimate the second SOC value SOC2 of the auxiliary measurement energy-storing component 120 by using lookup table. In some embodiments, the auxiliary measurement energy-storing component 120 can be operated as the specific energy-storing component of the main circuit of the battery controller 105A connected in series, and is configured to be operated as an aligned element to estimate the residual SOC of the battery control system 100A. As the aforementioned, the open-circuited voltage OV of the auxiliary measurement energy-storage component 120 and the second SOC value SOC2 have an obvious identifiability of the slope. Therefore, in some embodiments, the two-dimension curve and the slope of the open-circuited voltage OV of the auxiliary measurement energy-storing component 120 versus the second SOC value SOC2 can be recorded as the SOC data D which can be stored in the memory (such as the memory as shown in FIG. 1C) so that the first SOC value SOC1 of the battery module 110 can be calculated by measuring the open-circuited voltage OV of the auxiliary measurement energy-storing component 120 and performing the lookup table estimation with the SOC data D stored in the memory. In some embodiments, the control unit 130 may further calculates the second SOC value SOC2 according to the lookup table, such that the first SOC value SOC1 can be estimated, and the current residual SOC of the battery module 110 can be accurately estimated without generating accumulated errors.

In some embodiments, the control unit 130 calculates the current power consumption of the auxiliary measurement energy-storing component 120 according to the maximum SOC value of the auxiliary measurement energy-storing component 120 and the current second SOC value SOC2.

And then the control unit 130 calculates the residual SOC of battery module 110 according to the SOC of the power consumption of the auxiliary measurement energy-storing component 120 and the maximum SOC value of the battery module 110. In some embodiments, the battery module 110 is coupled in series to the auxiliary measurement energy-storing component 120. Therefore, the value of current flowing through the battery module 110 will be same as the current of the auxiliary measurement energy-storing component 120, the battery module 110 and the auxiliary measurement energy-storing will have the same power consumption at the same time.

As the embodiments shown in FIG. 1A, the measuring unit 140 is coupled to the control unit 130 and the auxiliary measurement energy-storing component 120, and is configured to measure the current flowing through the auxiliary measurement energy-storing component 120 for calculating the residual SOC by the control unit 130. In some embodiments, the measuring unit 140 is implemented with the current sensor or the other suitable current sensing element, but the disclosure should not be limited by these terms.

The protection unit 150 is coupled to the measuring unit 140 and the battery module 110, and is configured to limit the aforesaid current value to be not greater than the predetermined value to keep the battery controller 105A in safe. In some embodiments, the protection unit 150 is implemented with the over current protection, the relay, the fuse or other similar elements, but the disclosure should not be limited by these terms. The protection unit 150 turns off the circuit or sends out the warning to alert the user in response to that the value of current flowing through the battery controller 105A exceeds the aforesaid predetermined value.

Figure 1B:
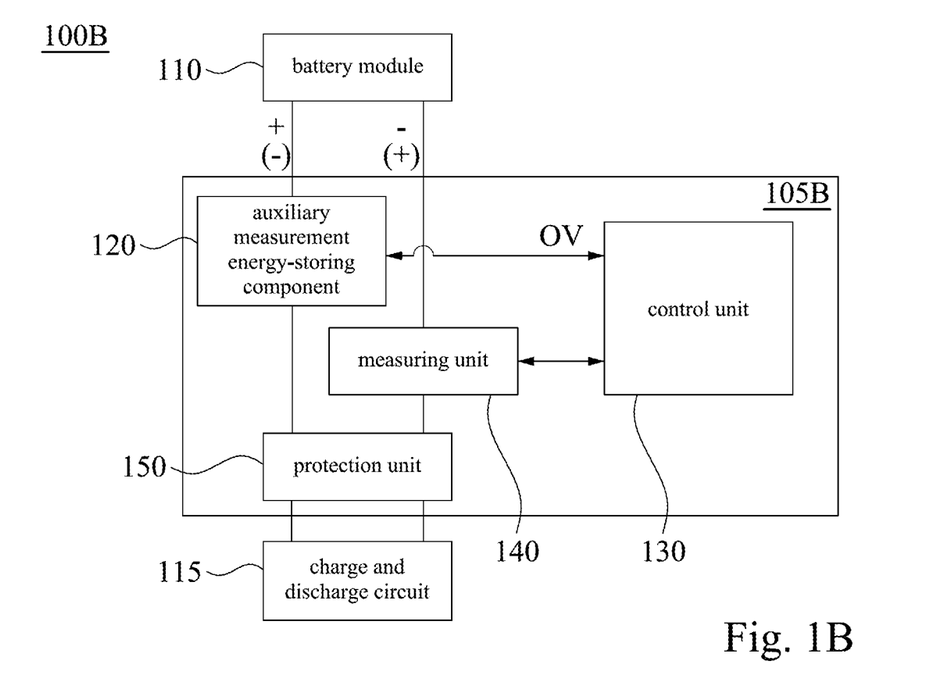
FIG. 1B is a schematic diagram of a battery control system in accordance with one embodiment of the present disclosure.
Figure 1C:
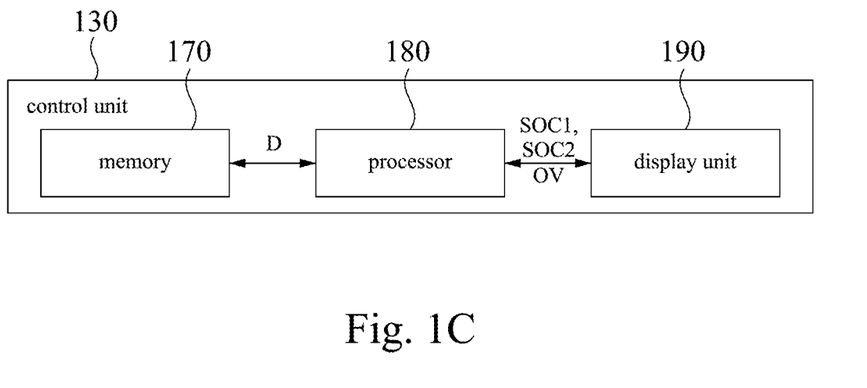
FIG. 1C is a schematic diagram of a control unit in accordance with one embodiment of the present disclosure.

Reference is made to FIG. 1B. FIG. 1B is a schematic diagram of the battery control system 100B in accordance with other embodiments of the disclosure. The battery control system 100B shown in FIG. 1B is similar to the battery control system 100A shown in FIG. 1A. The difference is that the auxiliary measurement energy-storing component 120 shown in FIG. 1B is not coupled in series to the measuring unit 140. Furthermore, the auxiliary measurement energy-storing component 120 and the measuring unit 140 are respectively disposed on different current paths coupled to the battery module 110, and the auxiliary measurement energy-storing component 120 and the measuring unit 140 are coupled between the battery module 110 and the protection unit 150.

As the embodiment shown in FIG. 1B, the measuring unit 140 is coupled to the control unit 130 and the battery module 110, and is configured to measure the current value of the current flowing through the battery module 110 for calculating the residual SOC by the control unit 130. In some embodiments, the measuring unit 140 is implemented with the current sensor or the other suitable current sensing element, but the disclosure should not be limited by these terms. In some embodiments, the function of the individual element or the unit of the battery control system 100B are similar to the corresponding function of the individual element or the unit of the battery control system 100A, so no more tautology here.

Reference is made to FIG. 1C. FIG. 1C is a schematic diagram of the control unit 130 in accordance with some embodiments of the present disclosure. Referring to FIG. 1C, the control unit 130 includes the memory 170, the processor 180 and the display unit 190, wherein the processor 180 is coupled between the memory 170 and the display unit 190.

The memory 170 is configured to store the SOC data D related to the auxiliary measurement energy-storing component 120. In some embodiments, the SOC data D is a ratio constituted by both the open-circuited voltage OV of the auxiliary measurement energy-storing component 120 and the SOC. In other words, the SOC data D is constituted by both the open-circuited voltage OV and the SOC, and the value of these two parameters could be drawn as a curve in the two dimensional coordinate plane (as shown in FIG. 2B). Consequently, the change of the slope can be recorded.

In some embodiments, the memory 170 is implemented with non-transitory computer-readable medium. In some embodiments, the computer readable mediums can be the electrical, magnetic, optical, infrared and/or semiconductor system (or the equipment or device.) Such as, the computer-readable medium includes the semiconductor or the solid-state memory, the magnetic tape, the removable computer disk, the random access memory (RAM), the read-only memory (ROM), hard disk and/or optical disk. In one or multiple embodiments of using the optical disk, the computer readable medium includes compact read-only memory disc (CD-ROM), compact rewritable disc (CD-R/W) and/or digital video disc (DVD).

The processor 180 is configured to determine the condition of battery module 110 according to the current measured by the measuring unit 140. In response to that the current value is not equal to zero, the processor 180 determines the battery module 110 as in a dynamic condition, this represents the battery module 110 is supplying with the power. Meanwhile, the processor 180 utilizes the Coulomb counting method to calculate the present residual SOC of the battery module 110 according to the current value, and outputs the first SOC value SOC1 of the battery module 110 to the display unit 190.

In response to that the current value is equal to zero, the processor 180 determines the battery module 110 as in a static condition, which represents the battery module 110 be in an idle state and does not supply the power. Meanwhile, processor 180 measures the open-circuited voltage OV of the auxiliary measurement energy-storing component 120 and performs the lookup table operations with the SOC data D stored in the memory to estimate the present residual SOC of the auxiliary measurement energy-storing component 120, and the estimated value is marked as the second SOC value SOC2.

In some embodiments, the Coulomb counting method also known as current integration method, which is performed the current value-time integration via the current value measured directly by the control unit 130 to calculate the value of SOC. The Coulomb counting method is an intuitive way to estimate the values of SOC, and it may calculate the consumed or replenished power to estimate the residual SOC of the battery.

In some embodiments, the processor 180 is further configured to estimate the first SOC value SOC1 of the battery module 110 according to the second SOC value SOC2 of the auxiliary measurement energy-storing component 120 and output the first SOC value SOC1 of the battery module 110 as a battery level, and the battery level is transmitted to the display unit 190, such that the display unit 190 can display the battery level.

In each of the embodiments of the present disclosure, the processor 180 can be implemented by the central processing unit, application-specific integrated circuit, the multiprocessor, the decentralized processing system or the suitable processing circuit, these elements should not be limited by these terms.

In some embodiments, the display unit 190 can be implemented by a display device, configured to display images and data, the element should not be limited by these terms. In some embodiments, the display unit 190 can be implemented by various screens, the control unit 130 controls screens to display a picture, the picture may include multiple layers, wherein these layers is configured to display different applications, a graphical user interface, a system status bar, a task bar, etc. In some other embodiment, the control unit 130 can further includes a graphics card (not shown) or a video processing circuit (not shown) and other circuit components. The circuit elements of above mention can be controlled by the processor 180, in order to provide a processed image data to the display unit 190 to display.

The aforesaid structure of the control unit 130 is illustration purposes only, but the present disclosure is not limited thereto. The structure of control unit 130 of the present disclosure can be changed and adjusted without departing from the scope or spirit of the disclosure. For example, in different embodiments, the control unit 130 can be implemented by a central processing unit, microprocessor or the other suitable processor directly, without the aforesaid display unit 190 and/or the memory 170.

Figure 3:
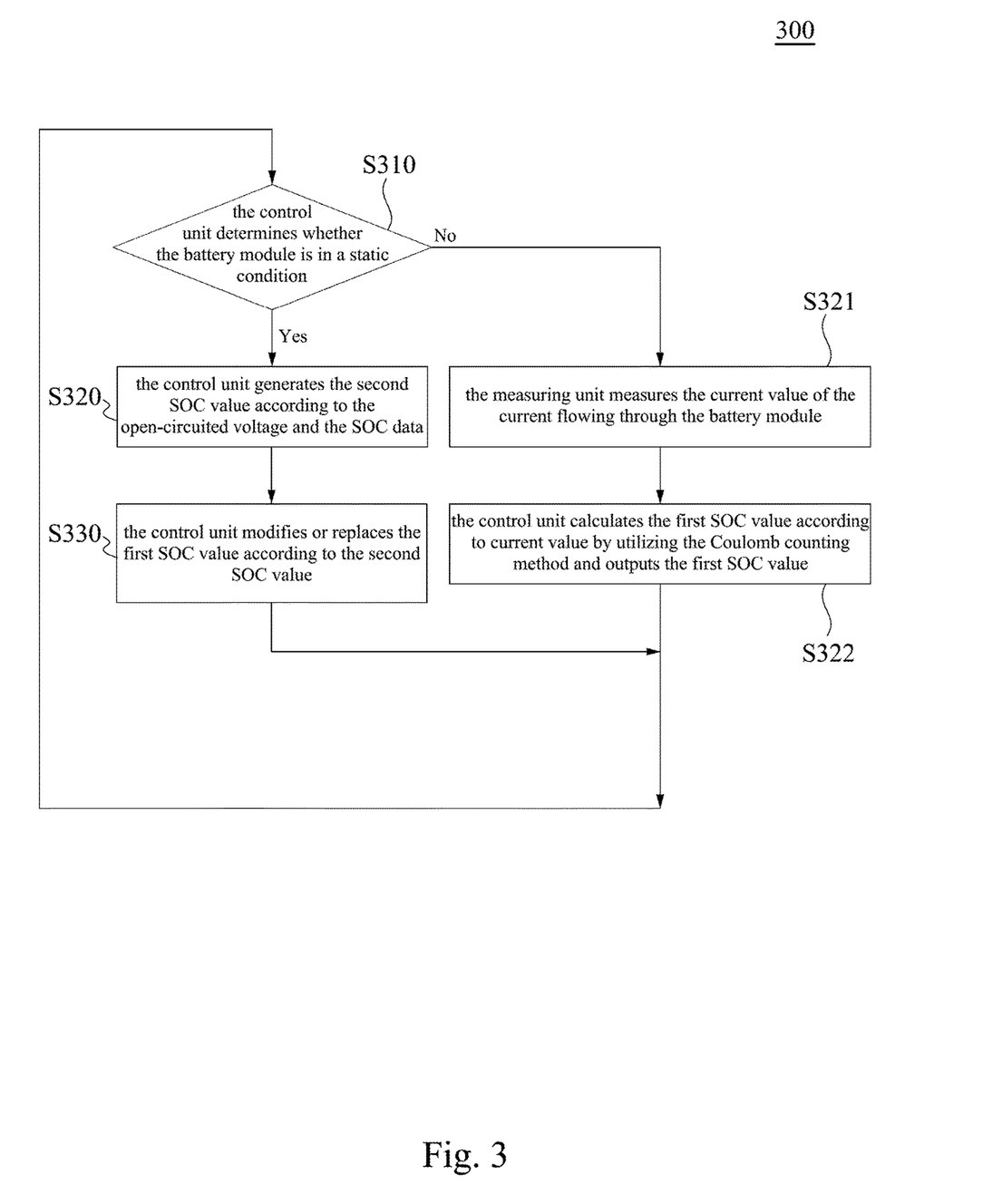
FIG. 3 is a schematic diagram of a discharge curve of the operation flowchart of the measurement method in accordance with one embodiment of the present disclosure.

FIG. 3 is an operation flowchart illustrating measurement method 300 in accordance with some embodiments of the present disclosure. Referring to FIG. 3, the measurement method 300 determines the current usage status of the battery by detecting the whole battery loop current and cooperating with a lookup table and the Coulomb counting method to correct the estimate accuracy of the residual SOC. The below mentioned measurement method 300 with the battery controller 105B shown in FIG. 1B are the illustrations, and the measurement method 300 is not limited to the application of the battery controller 105B as shown in FIG. 1B, that is the measurement method 300 can be applied in any similar circuit.

In the operation S310, the control unit 130 determines whether the battery module 110 is in a static condition. In other words, the control unit 130 determines the operating mode of the battery module 110 according to the current value. If the measured current value is equal to zero, the battery 110 is determined as in a static condition and the operation S320 is performed. If the measured current value is not equal to zero, the battery 110 is determined as a dynamic condition. And then, the operation S321 is performed.

In the operation S320, the control unit 130 generates the second SOC value SOC2 according to the open-circuited voltage OV and the SOC data D. Specially, the control unit 130 compares the SOC data D stored in memory 170 according to the open-circuited voltage OV of the auxiliary measurement energy-storing component 120, in order to generate the second SOC value SOC2.

In the operation S330, the control unit 130 modifies or replaces the first SOC value SOC1 according to the second SOC value SOC2. Specially, the control unit 130 estimates the first SOC value SOC1 according to the second SOC value SOC2 and modifies or replaces the first SOC value SOC1 in response to the second SOC value SOC2 is different from the first SOC value SOC1. In other words, the second SOC value SOC2 of the auxiliary measurement energy-storing component 120 will be in contrast with the first SOC value SOC1 of the battery module 110 by the control unit 130, the control unit 130 outputs the second SOC value SOC2 to replace the first SOC value SOC1 in response to that the second SOC value SOC2 is not equal to the first SOC value SOC1. On the other hand, the control unit 130 outputs the second SOC value SOC2 will be substantially the same as the first SOC value SOC1 of the battery module 110 in response to that the second SOC value SOC2 is equal to the first SOC value SOC1 without affecting the original circuit operation.

Back to the operation S310, the battery module 110 be in a dynamic condition since the current value is not zero, meanwhile the operation S321 is continuously performed by the measuring unit 140 to measure the current value of the current flowing through the battery module 110.

Then, in the operation S322, the control unit 130 calculates the first SOC value SOC1 according to current value by utilizing the Coulomb counting method and outputs the first SOC value SOC1. Specially, the control unit 130 calculates the first SOC value SOC1 of the battery module 110 according to current value by utilizing the Coulomb counting method, and outputs the first SOC value SOC1.

In the aforesaid operation, in response to that the control unit 130 determines the battery module 110 as in a dynamic condition, the control unit 130 can perform the Coulomb counting method with the current value measured by the measuring unit 140 to calculate the residual SOC of the battery module 110. On the other hand, in response to that the control unit 130 determines the battery module as in a static condition, the control unit 130 measures the open-circuited voltage OV of the auxiliary measurement energy-storing component 120 and contrasts the open-circuited voltage OV with the SOC data D stored in the memory 170 in order to further calculate the residual SOC of the battery module 110. Therefore, the battery module 110 can utilizes different residual SOC estimation methods for different conditions according to the measurement method 300, in order to correct the accumulated errors generated by utilizing only the Coulomb counting method.

The aforesaid descriptions of the operations S310 to S340 may refer to previous figures of the embodiments, so no more tautology here. The multiple operations of aforesaid multiple operations of the measurement method 300 are examples only and are not limited to the sequential execution of the above examples. Without departing from the operation mode and scope of the embodiments of the present invention, various operations under the measurement method 300 can be appropriately added, replaced, omitted, or performed in different orders.

In summary, the embodiment of the disclosure is an auxiliary measurement energy-storing component coupled in series to the battery to be measured, and estimating the residual SOC of the battery to be measured according to the open-circuited voltage of the auxiliary measurement energy-storing component in response to that the battery be in a static condition, which can avoid the inaccuracy caused by the accumulated errors of the traditional method and prevent the battery damage caused by the overcharge or discharge and estimates residual SOC accurately, in order to improve user experience.

Although the disclosure has been disclosed as above in the implementation mode, it is not limited to this disclosure. Anyone who is familiar with this skill can make various modifications and retouches without departing from the spirit and scope of this case. Therefore, the scope of protection in this disclosure shall be determined by the scope of the attached patent application.

What is claimed is:

1. A battery controller, comprising:
   an auxiliary measurement energy-storing component coupled in series to a battery module outside the battery controller, wherein the auxiliary measurement energy-storing component is configured to provide an open-circuited voltage of the auxiliary measurement energy-storing component;
   a control unit coupled to the auxiliary measurement energy-storing component, and the control unit configured to measure the open-circuited voltage of the auxiliary measurement energy-storing component, wherein the control unit is configured to output a first state of charge (SOC) value of the battery module according to the open-circuited voltage to be measured and state of charge (SOC) data corresponding to the open-circuited voltage to be measured;
   a measuring unit coupled to the control unit and the battery module, wherein the measuring unit is configured to measure a current flowing through the battery module, and transmit a measured result of the current flowing through the battery module to the control unit, the measured result is utilized by the control unit to output the first SOC value; and
   a protection unit coupled to the measuring unit, wherein the protection unit is configured to limit a current value of the current flowing through the battery module measured by the measuring unit to be not greater than a predetermined value,
   wherein the auxiliary measurement energy-storing component is coupled in series to the protection unit.

2. The battery controller of claim 1, wherein the control unit comprises:
   a processor configured to perform steps according to the current value of the current flowing through the battery module, the steps comprise:
   in response to that the current value is not zero, determining the battery module as in a dynamic condition, and outputting the first SOC value according to the current value; and
   in response to that the current value is equal to zero, determining the battery module as in a static condition, and generating a second state of charge (SOC) value according to the open-circuited voltage and the SOC data.

3. The battery controller of claim 2, wherein the processor is further configured to output the first SOC value according to the second SOC value.

4. The battery controller of claim 2, wherein the SOC data is related to a ratio between the open-circuited voltage and the second SOC value.

5. The battery controller of claim 2, wherein a maximum of the first SOC value is less than or equal to a maximum of the second SOC value.

6. The battery controller of claim 1, wherein the protection unit is configured to be implemented with an over current protection, a relay or a fuse.

7. The battery controller of claim 1, wherein the auxiliary measurement energy-storing component comprises a lithium cobalt oxide battery, a lithium manganese oxide battery, a lithium nickel oxide battery, a lithium nickel manganese oxide battery, an electric double layer capacitor or a combination of above batteries or capacitor.

8. A measuring method, comprising:
   providing an open-circuited voltage of an auxiliary measurement energy-storing component by the auxiliary measurement energy-storing component;
   measuring the open-circuited voltage of the auxiliary measurement energy-storing component and outputting a first state of charge (SOC) value, by a control unit, according to the open-circuited voltage to be measured and state of charge (SOC) data corresponding to the open-circuited voltage to be measured;

measuring a current value of current flowing through a battery module by a measuring unit, wherein the current value is utilized by the control unit to output the first SOC value; and limiting the current value to a predetermined value by a protection unit, wherein the auxiliary measurement energy-storing component is coupled in series to the battery module and the protection unit.

9. The measurement method of claim 8, wherein outputting the first SOC value by the control unit according to the open-circuited voltage and SOC data, comprising:

storing the SOC data related to the auxiliary measurement energy-storing component by a memory; and performing steps by a processor according to the current value measured by the measuring unit, the steps comprise:

in response to that the current value is not zero, determining the battery module as in a dynamics condition, and outputting the first SOC value; and in response to that the current value equal to zero, determining the battery module as in a static condition, and outputting a second state of charge (SOC) value according to the open-circuited voltage and the SOC data.

10. The measurement method of claim 9, further comprising:

outputting the first SOC value by the processor according to the second SOC value.

11. The measurement method of claim 9, wherein the SOC data is related to a ratio between the open-circuited voltage and the second SOC value.

12. The measurement method of claim 9, wherein a maximum value of the first SOC value is not greater than a maximum value of the second SOC value.

13. The measurement method of claim 8, further comprising:

in response to that the current value is greater than the predetermined value, turning off the measuring unit by the protection unit.

* * * * *